United States Patent [19]

Pascoe et al.

[11] 4,245,355
[45] Jan. 13, 1981

[54] MICROWAVE FREQUENCY CONVERTER

[75] Inventors: Robert W. Pascoe; Richard W. Thill, both of San Jose, Calif.

[73] Assignee: Eaton Corporation, Cleveland, Ohio

[21] Appl. No.: 64,551

[22] Filed: Aug. 8, 1979

[51] Int. Cl.³ .............................................. H04B 1/26
[52] U.S. Cl. ................................. 455/326; 455/330; 455/331
[58] Field of Search .............. 455/313, 318, 323, 325, 455/326, 330, 331, 332, 333, 319

[56] References Cited

U.S. PATENT DOCUMENTS 3,983,489 9/1976 Gittinger .............................. 455/331

Primary Examiner—Marc E. Bookbinder
Attorney, Agent, or Firm—Kevin Redmond

[57] ABSTRACT

A frequency converter, incorporating a subharmonic mixer and a YIG tuned local oscillator filter in an integrated circuit configuration, provides improved conversion efficiency and ease of fabrication.

5 Claims, 15 Drawing Figures

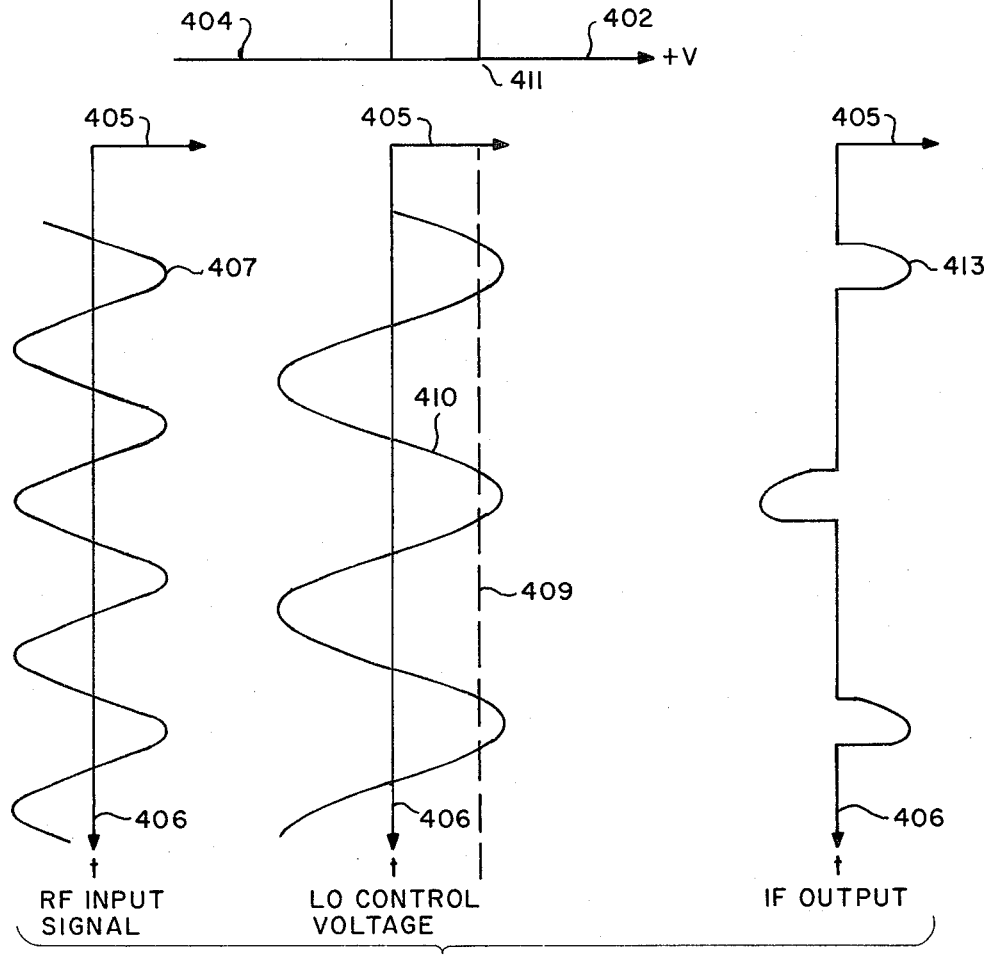
FIGURE 4A PRIOR ART
FIGURE 4B PRIOR ART
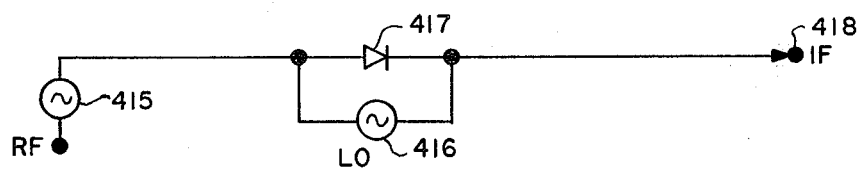
FIGURE 4C PRIOR ART

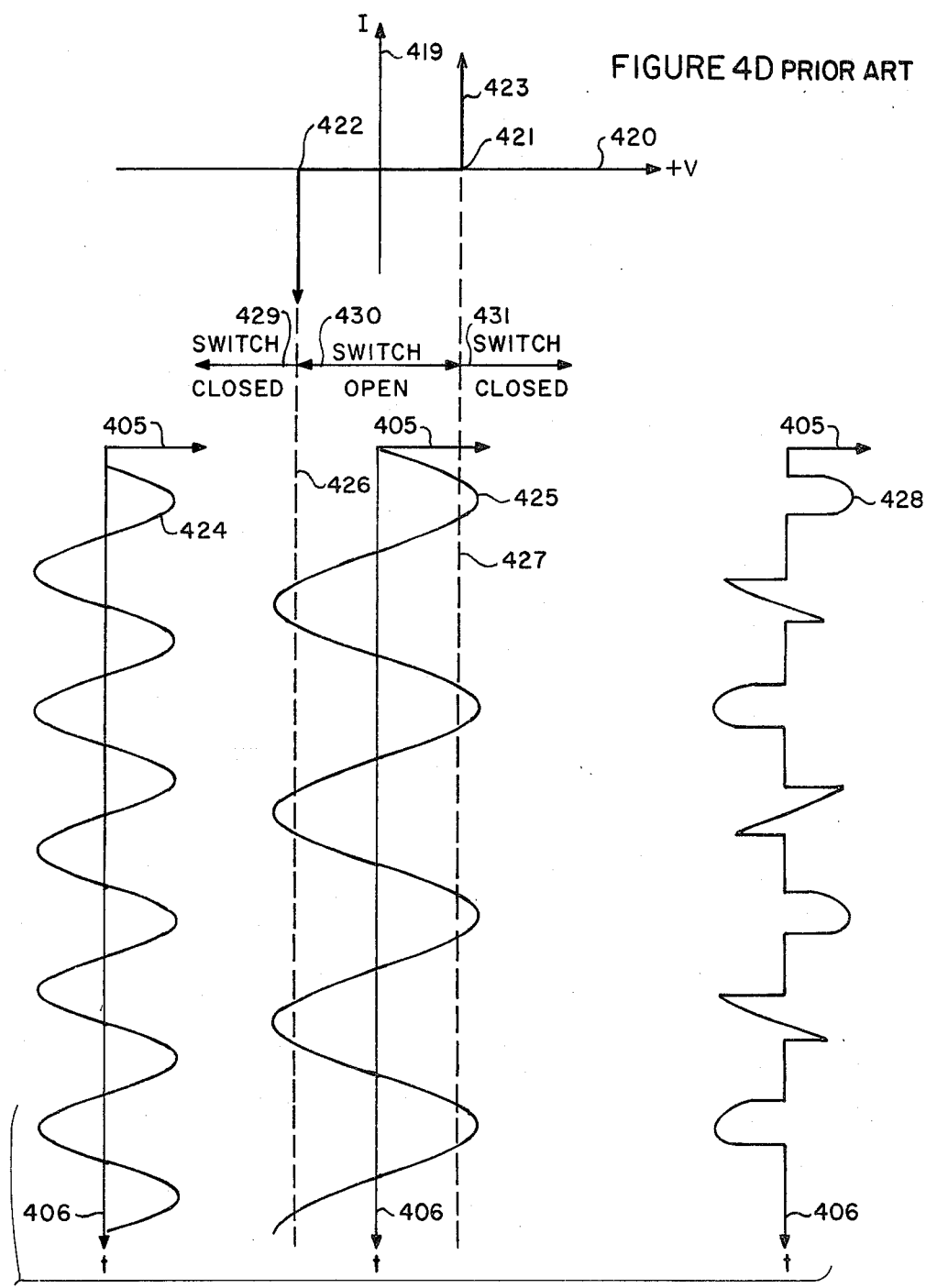
FIGURE 4D PRIOR ART
FIGURE 4E PRIOR ART
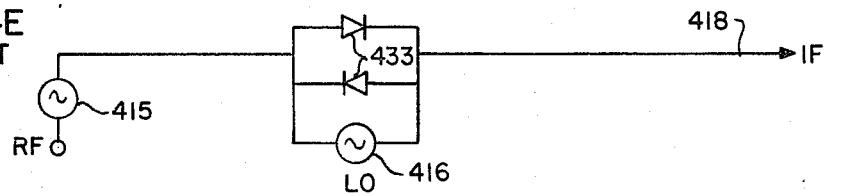
FIGURE 4F PRIOR ART

:::page
4,245,355

MICROWAVE FREQUENCY CONVERTER

BACKGROUND

1. Field

This invention relates to broadband microwave frequency converters and, in particular, to converters incorporating subharmonic mixers.

2. Prior Art

Frequency converters at microwave frequencies typically use a configuration similar to that shown in FIG. 6A. In this Figure, a mixer 602, having an RF input port 601, an IF output port 603, and an LO input port 604, is supplied with LO power from a LO source comprising a frequency source 607, a step recovery diode 606, and a YIG filter 605.

In the operation of the frequency converter of FIG. 6, the frequency source drives the step recovery diode which, in turn, produces a signal output having a spectrum containing a number of harmonics of the frequency source.

The output spectrum of a step recovery diode is shown in FIG. 6B. In this Figure, the ordinate 620 represent amplitude while the abscissa 611 represents frequency. The number of evenly spaced harmonic signals, such as harmonic 610, are referred to as comb frequencies.

In the operation of the frequency converter, a particular comb frequency is selected by the YIG filter. By tuning the YIG filter, different comb frequencies are selected to change the RF frequency which provides a desired IF frequency.

The amplitude of the comb frequencies signals decreases rapidly as higher frequency signals are selected. For example, in FIG. 6B, the amplitude of a comb signal 616 at 26 GHz may be 20 dB lower than a comb signal 615 at 13 GHz, a decrease of 20 dB for only a factor of two increase in frequency.

This decrease in LO power with increasing frequency greatly increases the conversion loss of a conventional mixer at higher frequencies, as illustrated in FIG. 6C. In this Figure, the ordinate 612 represents conversion loss, while the abscissa 614 represents local oscillator power. The conversion loss characteristic 613 can be seen to drop from 15 dB at an LO power of −10 dBm to 55 dB at an LO power of −30 dBm. Stated another way, a 20 dB loss in LO power, due to selecting a comb at twice the starting frequency, will result in a 40 dB increase conversion loss.

SUMMARY

By substituting a subharmonic mixer for a conventional mixer in a microwave frequency converter, the maximum LO frequency required is reduced by a factor of two with respect to the LO frequency required for a conventional mixer. A YIG filter with two sections is configured to function as a balun in a balanced mixer. The converter is made using microwave integrated circuit techniques to simplify the circuitry and thus facilitate fabrication.

BRIEF DESCRIPTION OF THE FIGURES

FIGS. 4A and 4D are idealized current-voltage characteristics of a single diode mixer and subharmonic mixer.

FIGS. 4B and 4E are representations of the waveforms associated with conventional and subharmonic mixers shown in FIGS. 4C and 4F, respectively.

DETAILED DESCRIPTION OF THE INVENTION

Figure 1:
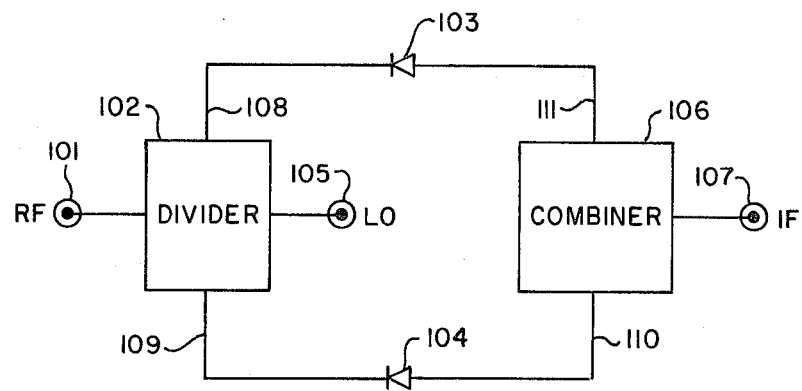
FIG. 1 is a block diagram of a conventional single balanced mixer.

A rudimentary single balanced conventional mixer is illustrated in FIG. 1. This mixer includes a divider 102 with two input ports, 101 and 105, and two output ports, 108 and 109. Each output port of the hybrid divider is connected to one lead of a diode, such as diode 103 or 104. The other lead of each diode is connected to one of the two input ports of a combiner 106. The IF signal is provided at the output port 107 of the combiner 106.

In the operation of the mixer of FIG. 1, an RF signal applied to input port 101 of divider 102 is supplied in phase to diodes 103 and 104. An LO signal applied to input port 105 of divider 102 is supplied out of phase to diodes 103 and 104.

The RF and LO signals are mixed in the diodes to produce separate IF signal in each diode, which are delivered to combiner 106 where they are combined and then supplied at output port 107.

Figure 2:
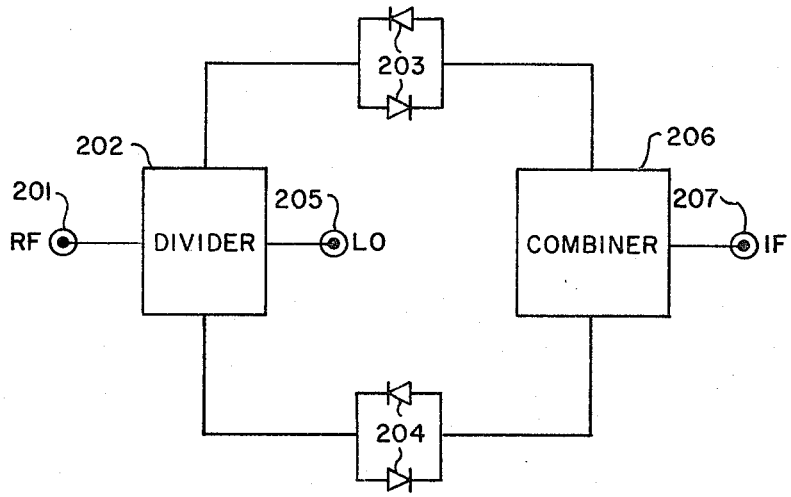
FIG. 2 is a diagram of a single balanced subharmonic mixer.

A single balanced subharmonic mixer is illustrated in FIG. 2. Its configuration is similar to that of FIG. 1, with the exception that the two individual diodes, 103 and 104, of FIG. 1, are replaced with the antiparallel diode pairs 203 and 204 in FIG. 2. The divider 202 and the combiner 206 in FIG. 2 perform the same respective functions as the divider 102 and combiner 106 in FIG. 1.

Figure 3A:
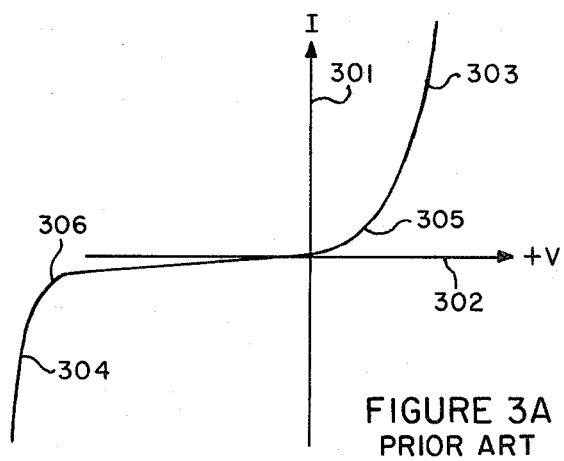
FIGS. 3A and 3B are graphs of the current-voltage characteristic of a single diode and a pair of antiparallel diodes, respectively.
Figure 3B:
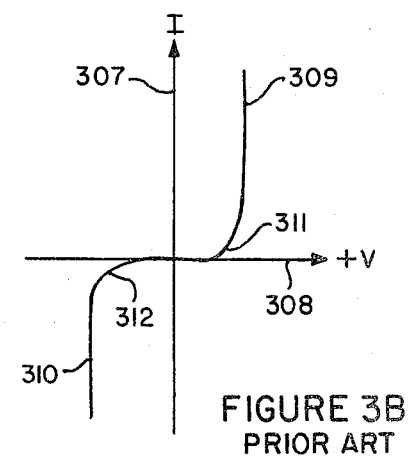

FIG. 3A shows the current-voltage characteristics of a conventional diode, while FIG. 3B shows the current-voltage characteristic of an antiparallel diode pair. In these Figures, the diode current is represented by the ordinates 301 and 307, while the abscissas, 302 and 308, represent the applied voltage. Referring to FIG. 3A, the conventional diode forward bias characteristic 303 is not symmetrical with respect to the reverse bias characteristic 304. Notably, the forward inflection point 305 occurs at a smaller voltage magnitude than does the reverse breakdown voltage 306.

The current-voltage characteristic of an antiparallel diode pair, as shown in FIG. 3B, has odd symmetry about the origin. The forward bias characteristic 309 of one diode is mirroed by the forward bias characteristic 310 of the other diode. The inflection points, 311 and 312, are symmetrical as well. Notable is the absence of a reverse breakdown characteristic, as exhibited in FIG. 3A for the conventional diode.

FIGS. 4A, B, and C are representations of various waveforms and a schematic associated with a conventional mixer diode.

For illustrative purposes, a conventional mixer diode can be modeled as a voltage controlled switch located between an RF signal source and an IF load. The state of the switch, either opened or closed, is determined by the polarity and amplitude of the LO signal applied across the diode terminals. In the conventional mixer diode, the switch is closed, that is, the RF signal is connected to the IF load, when the local oscillator voltage exceeds a specific positive amplitude, and is opened otherwise. A conventional diode mixer is represented by the diagram shown in FIG. 4C. In this Figure, an RF generator 415 supplies an RF signal to a diode switch 417 which is controlled by a signal from a local oscillator generator 416. The IF output signal is supplied at the output port 418.

As shown in FIG. 4B, the result of alternately connecting and disconnecting the RF signal from the IF load is a modulated RF signal at the IF port with a primary frequency component equal to the difference between the RF and LO frequencies.

FIG. 4A represents the current-voltage characteristic of a conventional diode. In this Figure, the ordinate 401 represents current, while the abscissa 402 represents voltage. The forward diode characteristic 403 is shown to have a threshold voltage 411. The reverse diode characteristic 404 theoretically represents an infinite resistance or an open switch position.

FIG. 4B contains three plots of voltage waveforms that represent the RF, local oscillator and resulting IF signals from the circuit shown in FIG. 4C. In al of the waveform plots of FIG. 4, the voltage axis is indicated by drawing numeral 405, while the time axis is indicated by drawing numeral 406. Waveform 407 represents the RF signal, waveform 410 represents the local oscillator signal and waveform 413 represents the IF signal. The line 409, which is drawn directly beneath the threshold voltage 411, represents the local oscillator voltage at which the diode switch 417 in FIG. 4C is turned on o produce the IF output signal 413.

In comparison, an antiparallel diode pair, as shown in FIG. 4F, is closed when the LO voltage exceeds a specific positive or negative amplitude, and is open otherwise. The result is that for a given LO signal frequency, the antiparallel pair switches at twice the rate of a single diode. Conversely, for a desired switching rate, the antiparallel diode pair requires an LO signal at only one-half the frequency required by the conventional diode. In effect, the antiparallel diode pair, as used in a subharmonic mixer, enables a local oscillator signal at one frequency to provide performance comparable to an LO signal of twice the frequency applied to a conventional mixer diode.

Figure 6A:
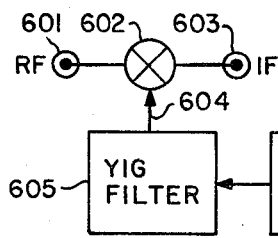
FIGS. 6B and 6C illustrate the performance characteristics of a conventional step recovery diode harmonic frequency converter shown in FIG. 6A.
Figure 6B:
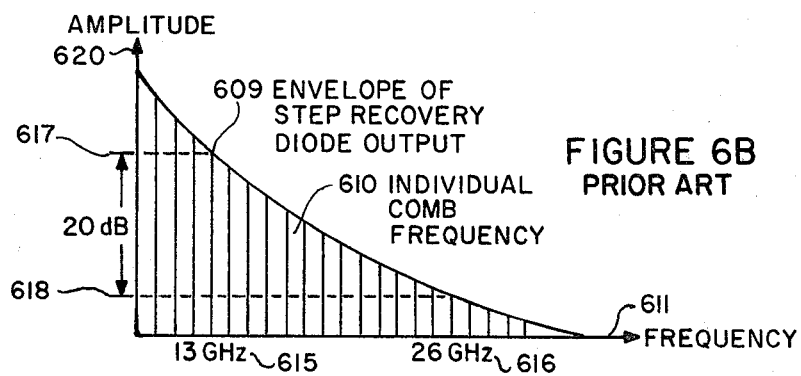
Figure 6C:
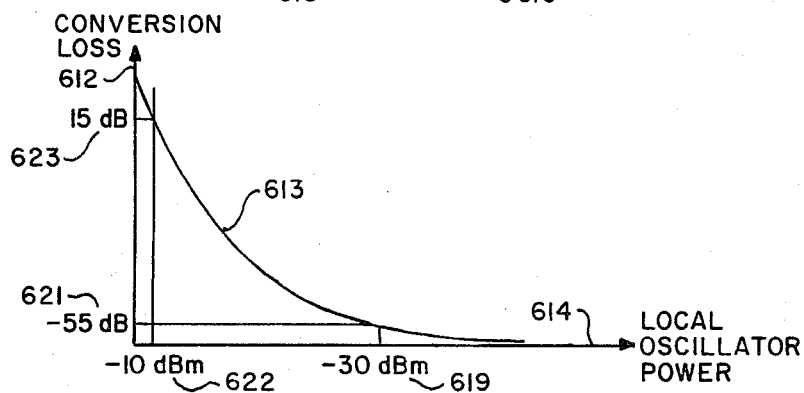

This feature is important in those mixer applications which normally require a very high frequency LO source. Since the subharmonic mixer effectively doubles the LO input frequency, the maximum external LO frequency requirement is halved with respect to a conventional mixer, with substantial performance improvements. In the present invention, this feature is used to overcome the great increase in conversion loss associated with selecting a high order comb frequency signal, as illustrated in FIG. 6. In addition, while conventional mixers are subject to reverse breakdown failure from excessive input voltage, the antiparallel diode mixer is immune to this failure mode.

FIGS. 4D, E, and F correspond to FIGS. 4A, B, and C, but cover the subharmonic case rather than that of the conventional mixer. FIG. 4D shows the current-voltage characteristic of an antiparallel diode pair. In this Figure, the ordinate 419 represents the current axis, while the abscissa 420 represents the voltage axis. The antiparallel diode pair has a positive threshold at a voltage designated by drawing numeral 421 and a negative threshold at a voltage represented by drawing numeral 422.

FIG. 4E shows an RF waveform 424, an LO waveform 425 and an IF waveform 428 associated with a subharmonic mixer. Lines 426 and 427 represent the threshold voltages of the antiparallel diode pair. FIG. 4F is identical to FIG. 4C except for the replacement of the single diode switch 417 with the antiparallel diode pair 433.

Figure 5A:
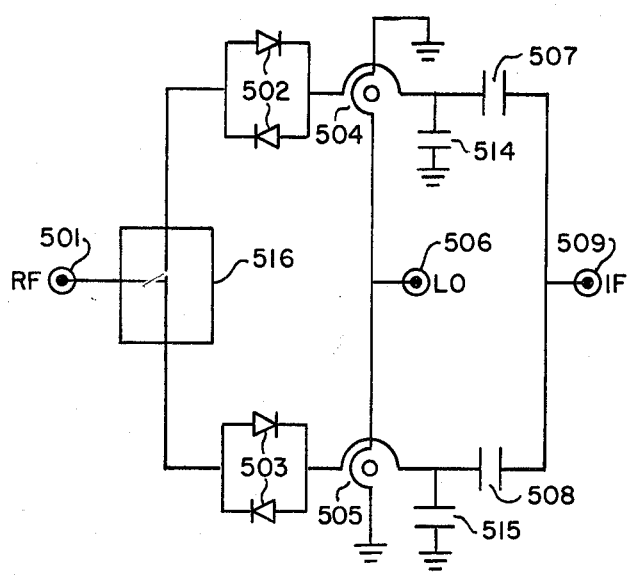
FIG. 5A is a schematic of a single balanced subharmonic mixer, with a YIG tuned LO balun for use in a practical microwave frequency converter which constitutes the subject invention.

A practical implementation of a combined subharmonic mixer and a YIG filter is shown in FIG. 5A. This device comprises an RF input port 501, a first antiparallel diode pair 502, a second antiparallel diode pair 503, a first section of a YIG filter 504, a second section of a YIG filter 505, an LO port 506, RF bypass capacitors 514 and 515, IF coupling capacitors 507 and 508, IF output port 509, and RF power divider 516.

In the operation of the mixer and LO filter of FIG. 5A, the RF input signal is passed through input port 501, divided in power divider 516 and then supplied in-phase to antiparallel diode pairs 502 and 503. The LO signal from a source such as a step recovery diode is divided and supplied out-of-phase to the diode pairs by way of the LO port 506 and YIG filter sections 504 and 505. The IF signal is then coupled from each diode pair by way of its respective IF coupling capacitor 507 or 508 to the IF output port 509.

Figure 5B:
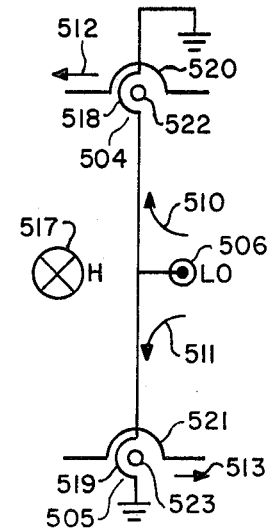
FIG. 5B is schematic of the YIG tuned sections of the subject invention.

The YIG filter sections perform the functions of a magnetically tunable filter and 180° hybrid divider. These functions can be understood with the aid of FIG. 5B. The two YIG filter sections 504 and 505 contain two YIG resonators, 522 and 523, respectively, which are typically spheres that are synchronously tuned by a uniform magnetic field 517, to couple an LO signal only over a narrow range around a desired frequency. An LO signal of the proper frequency applied to the LO port 506 is divided into two in-phase currents represented by arrows 510 and 511. Current 510 passes through a first coupling loop 518, while current 511 passes through a second identical coupling loop 519. Energy is magnetically coupled through YIG resonator 522 which induces current 512 in a third coupling loop 520 and through YIG resonator 523, which induces a current 513 in a fourth identical coupling loop 521. Because the resonators and their respective coupling loops are identical, and the structure is symmetrical, it inherently provides a 180° hybrid function. The opposing directions of the currents 512 and 513 illustrate the 180° characteristic of this structure.

To simplify the mixer structure and aid in understanding its operation, the mixer alternatively may be viewed as having two local oscillator ports at the points in the mixer circuit where the LO signal is supplied to the antiparallel diode pairs by the YIG filter sections. In this case the YIG filter sections are considered as components external to the mixer, used to supply the two mixer LO ports with out-of-phase LO signals.

The frequency converter of FIG. 5A has been implemented in a microwave integrated circuit (MIC) configuration where the line lengths between components may be kept to a small fraction of a wavelength. A frequency converter of comparable performance cannot normally be implemented by using discrete microwave components because the interconnecting line lengths and the impedance mismatches of individual components combine to produce large frequency dependent standing wave ratios.

The particular type of two secton YIG filter used in the present invention and illustrated in FIG. 5 has a number of advantages. Each section consists of two simple coupling loops, as opposed to mechanically complex tapped loop YIG filter structures used in prior art devices. The complete MIC frequency converter is placed between the poles of a single electromagnet to provide a uniform magnetic field to both YIG filter sections, causing them to track in frequency simultaneously.

It should be noted that multiple cascade filter sections may be substituted for the single representative filter sections shown in FIG. 5.

Having described our invention, we claim:

1. A frequency converter comprising:
 (a) a subharmonic mixer having one RF, one IF and two LO ports, said mixer including two pair of antiparallel diodes with each diode pair being connected to one respective LO port,
 (b) a band-pass filter having an input port and a pair of output ports, said output ports being connected to the LO ports of said subharmonic mixer, and
 (c) a local oscillator signal source having an output port at which a number of signals at different frequencies are produced simultaneously, said source output port being connected to the input port of said filter to supply said mixer through said filter with an LO signal at a single frequency selected from said number of signals from said source.

2. A frequency converter, as claimed in claim 1, wherein said local oscillator signal source is a comb generator.

3. A frequency converter as claimed in claim 1, wherein said filter is a tunable YIG filter.

4. A frequency converter as claimed in claim 3, wherein said mixer is single balanced, and said YIG filter comprises two separate, but substantially similar sections, each section having an input and output port and each being connected at their respective output ports to a different set of said diode pairs, while both sections are connected together at their input ports to form a single input port for said band-pass filter.

5. A frequency converter as claimed in claim 4, wherein said converter is fabricated by means of microwave integrated circuit techniques, said mixer RF port is connected to an RF divider to supply said diode pairs with the RF signal within said mixer, said RF divider comprising two transmission lines which are short with respect to a wavelength at the RF operating frequency and are joined together to form the RF input port of said mixer, said LO ports are connected to said YIG filter sections via LO transmission lines which are short with respect to a wavelength at the LO operating frequency, said YIG filter sections consist of YIG spheres and two orthogonal untapped coupling loops, with the local oscillator signal source being connected to opposite ends of the input coupling loops of each filter section respectively to provide out-of-phase local oscillator signals to the diode pairs, and both of said filter sections are located within a single magnetic field to provide frequency tracking of the filter sections.

* * * * *